United States Patent [19]

Bullock

[11] Patent Number: 4,893,742
[45] Date of Patent: Jan. 16, 1990

[54] ULTRASONIC LASER SOLDERING

[75] Inventor: Peter W. Bullock, San Luis Rey, Calif.

[73] Assignee: Hughes Aircraft Company, Los Angeles, Calif.

[21] Appl. No.: 287,763

[22] Filed: Dec. 21, 1988

[51] Int. Cl.$^4$ .................. B23K 20/10; B23K 26/00
[52] U.S. Cl. .................... 228/110; 228/179; 228/1.1; 228/262; 219/85.18; 219/121.63; 219/121.64
[58] Field of Search ............... 228/110, 111, 179, 1.1, 228/4.5, 262, 258; 219/85 F, 121.6, 121.65, 121.63, 121.64, 121.66

[56] References Cited

U.S. PATENT DOCUMENTS

| | | | |
|---|---|---|---|
| 3,304,403 | 2/1967 | Harper | 219/121.63 |
| 3,463,898 | 8/1969 | Takaoka et al. | 219/121.63 |
| 3,734,382 | 5/1973 | Spanjer | 228/1.1 |
| 3,874,963 | 4/1975 | Barger | 228/1.1 |
| 3,889,364 | 6/1975 | Krueger | 228/258 |
| 4,320,281 | 3/1982 | Cruickshank et al. | 219/121.64 |
| 4,534,811 | 8/1985 | Ainslie et al. | 228/1.1 |

FOREIGN PATENT DOCUMENTS

| | | | |
|---|---|---|---|
| 165333 | 12/1981 | Japan | 228/179 |
| 209493 | 12/1983 | Japan | 219/121.63 |
| 2333 | 1/1984 | Japan | 228/4.5 |
| 175736 | 10/1984 | Japan | 228/4.5 |
| 101043 | 5/1986 | Japan | 228/4.5 |
| 642114 | 1/1979 | U.S.S.R. | 228/179 |

OTHER PUBLICATIONS

Research Disclosure, "Improved Laser Microweld Technique", Kenneth Mason Publications LTD, England, No. 275, Mar. 1987.
IBM Technical Disclosure Bulletin, "Novel Laser Soldering Process . . .", vol. 3, No. 31, pp. 206, 207, Aug. 1988.

Primary Examiner—Richard K. Seidel
Assistant Examiner—Samuel M. Heinrich
Attorney, Agent, or Firm—Joseph E. Szabo; Wanda K. Denson-Low

[57] ABSTRACT

Laser soldering in a tape automated bonding procedure is carried out on outer ends of a number of high density leads (72) printed on a film (78) of mylar and having inner ends connected to a circuit chip (70). The outer ends of the leads are soldered, without the use of flux, by application of heat and ultrasonic energy in a timed program while pressing an end (52) of the lead to be soldered against the substrate pad to which it is to be soldered. An elongated ultrasonically vibratable capillary (16) is employed to press the wire down against its pad (54) and to receive and guide an optical fiber (44) through which a beam of laser energy is fed coaxially through the capillary (16) to heat the wire end (52).

21 Claims, 2 Drawing Sheets

ULTRASONIC LASER SOLDERING

BACKGROUND OF THE INVENTION

1. Field of the Invention

The present invention relates to methods and apparatus for soldering, and more particularly concerns fluxless soldering of high density leads of an electronic circuit chip.

2. Description of Related Art

Connection of electrical leads to integrated circuit or electrical microchip elements is accomplished by various procedures, including ultrasonic bonding and soldering. In ultrasonic bonding an end of a wire, generally of a circular cross section, is pressed against a pad to which it is to be bonded by the tip of a bonding tool that is connected to an ultrasonic transducer. Energization of the transducer while the bonding tool tip presses the wire against its pad deforms the wire under pressure and vibration, thereby providing an electrical connection. Soldering of leads is sometimes preferred for repairability and the ability to make many solder connections in one step. In conventional soldering, an end of the lead is held against a substrate pad to which it is to be bonded, solder is applied to the bonding area, and the parts are heated to cause the solder to flow around or between the parts, thereby to firmly connect the parts both mechanically and electrically upon cooling and solidification of the solder. Frequently the leads to be soldered are "pre-tinned", that is, pre-coated with a thin layer of solder, as by dipping, silk screening or plating, and a solder flux is applied to the bonded area to ensure the making of a proper bond.

In making solder connections at the outer ends of a large nubber of electrical leads that may radiate in many directions from a central electronic chip a single pressure foot or "thermode" is employed in a gang bonding operation to press ends of all the wires against their respective pads, and to simultaneously apply heat for melting the solder of the pre-tinned lead ends. The thermode is provided with a planar pressure surface that has a high precision of flatness. However, the substrate to which leads are to be bonded carries a number of pads that may be positioned at slightly different elevations, because cause of such factors as variation in thickness of pads and adhesive used to hold the pads, and irregular surfaces of the substrate which carries the pads. In other words, the surface of the pads to which the outer ends of the radiating wires that are to be bonded do not all lie in the same plane with any degree of precision. Accordingly, as the unitary thermode simultaneously presses the ends of as many as two to three hundred wires against the pads, some wire ends are not pressed or are not adequately pressed against the pads to which they are to be bonded, resulting in either a poor bond or total absence of bond at some wire end.

Flux, now widely used in soldering, introduces contaminants, is difficult to apply with precision, and, if excess flux is used, the appearance of the component may be degraded. There is always some residual flux remaining even after very careful cleaning of the parts.

Accordingly, it is an object of the present invention to provide for the bonding of electrical leads while avoiding or minimizing above-mentioned problems.

SUMMARY OF THE INVENTION

In carrying out principles of the present invention in accordance with a preferred embodiment thereof, soldering without the use of flux is performed by pressing a pair of members together at a common area to be soldered, applying solder to the area, applying a timed program of both heat energy and ultrasonic energy to one of the members. In one embodiment, apparatus for carrying out the invention employs a pressure tool having a pressure tip for pressing against the wire lead, means for vibrating the tool at an ultrasonic frequency, means for moving the tool to cause the pressure tip of the tool to press against a lead to be bonded, and means for applying heat to the lead at the pressure tip.

DESCRIPTION OF THE PREFERRED EMBODIMENT

Principles of the present invention may be carried out by various types of special machines that are arranged to provide the necessary features of the procedure of the present invention. The procedures of the present invention include (1) application of pressure, (2) application of ultrasonic energy, and (3) application of heat. For simplicity, efficiency and economy of design and manufacture applicant presently prefers to employ a bonding machine of the type presently used in ultrasonic bonding, because such a machine already performs two of the procedures of the present invention.

A number of different types of presently available ultrasonic bonding machines regularly apply pressure to one of two members to be bonded, and, while such pressure is applied, effect an ultrasonic vibration of at least one of the members to perform an ultrasonic bond. Applicant has found it convenient and advantageous to provide a relatively simple modification of such an ultrasonic bonding machine to enable it to apply heat at the tip of the bonding tool. As modified and applied to carry out procedures of the present invention, the machine is not used to perform ultrasonic bonding in the conventional sense. Exemplary of the many types of ultrasonic bonding tools that are presently available is a tool made by applicant's assignee and described in U.S. Pat. 4,718,591 issued Jan. 12, 1988 to William H. Hill for Wire Bonder With Open Center of Motion. Such an ultrasonic wire bonder may be readily modified to enable it to be used in the practice of the present invention. Another ultrasonic bonder which may be readily modified for practice of the present invention is that described in U.S. Pat. No. 4,598,853, of William H. Hill, for Open-Center Flexural Pivot Wire Bonding Head. In the apparatus of these patents, touchdown (e.g. initial contact of the tool tip with the wire, as the tool is lowered to contact the work) is sensed and signaled for starting the ultrasonic bonding, but the modified machines are not used for conventional ultrasonic bonding.

The above-mentioned machines, all of which may be readily modified for practice of the present invention, include some features which are neither necessary nor desirable in the practice of the present invention. For example, these machines incorporate a capability of rotation of the bonding head about the vertical axis of the capillary or bonding tool itself. Such a vertical axis rotation is neither necessary nor desirable for the present invention, and, therefore, may be eliminated from such machines, or simply not used. As presently contemplated, it is preferred to practice the present invention by employing a bonding machine of the type manufactured and sold by Hughes Aircraft Company, assignee of the present application, as the Hughes Model 2460-II Automatic Wire Bonder. Major components of such a machine, modified to incorporate principles of the present invention, are illustrated in FIG. 1.

Figure 1:
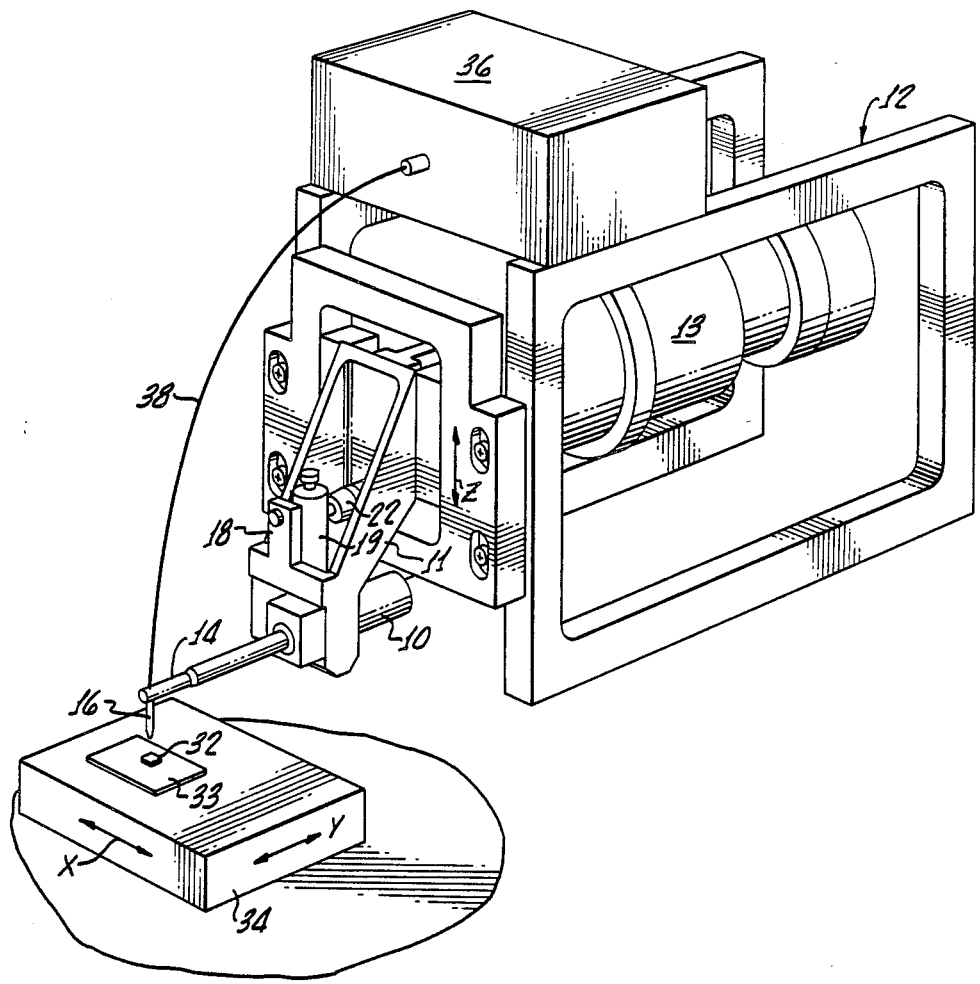
FIG. 1 is an illustration of the general construction of an exemplary bonding machine that may be employed to carry out principles of the present invention.

As illustrated in FIG. 1, the preferred Model 2460-II Automatic Wire Bonder includes an ultrasonic transducer 10 mounted for a slight amount of pivotal motion about a horizontal axis, parallel to the illustrated X axis, to a bonder slide frame 11 that is mounted for vertical or Z axis motion to a tooling fixture 12. Slide frame 11 is mounted for vertical motion in the fixture 12 by means of vertical guide ways (not shown) and driven up and down by a bi-directional Z axis motor 13 that is fixedly mounted to slide frame 11 for vertical motion therewith. The motor 13 carries a pinion (not shown) which meshes with racks (not shown) fixed to the tooling fixture 12. The sliding bond head assembly of transducer and slide frame is mounted so that the vertical drive motor 13 may drive the bond head assembly upwardly and downwardly along the Z axis. This precisely controls vertical position of the lower pressure tip of a bonding tool or capillary 16 that is carried by an elongated horizontal arm 14 fixed to transducer 10. Details of bonding tool 16 will be described below. The vertical drive arrangement provides for vertical motion of the tip of the bonding tool or capillary 16 to controlled vertical positions with respect to a semiconductor device or integrated circuit chip 32. The chip 32 is mounted on a substrate 33 carried on a work table 34 that is movable horizontally (along X and Y axes) under control of X and Y axis motors (not shown). The work table is movably mounted on a support (not shown) to which the tooling fixture is fixedly secured.

Touchdown of the capillary, that is, initial contact of the tip of the capillary with the workpiece (an electrical lead connected to chip 32) that is positioned below the descending tool, is signaled by a set of contacts (not shown) respectively mounted on the rear side of a column 18 fixed to slide frame 11 and on the forward side of a post 19 upstanding from the pivotally mounted transducer. Upon touchdown, the transducer 10 and tool 16 pivot very slightly to open these contacts and generate a touchdown signal. The touchdown signal stops vertical descent and initiates operation of a force solenoid 22 fixed to bonder slide frame 11 and positioned to contact a rearward side of post 19. The solenoid force tends to pivot the transducer and capillary so as to exert a predetermined or programmed amount of pre-load force on the work to be bonded.

In practice of the present invention, a prior art ultrasonic bonding machine, such as Hughes Model 2460-II Automatic Wire Bonder, shown in FIG. 1, is modified by replacing the ultrasonic bonding tool of the prior machine with a new type of bonding tool 16 to be more particularly described below and, further, by mounting to tooling fixture 12 a heat supply in the form of a pulsed laser assembly 36. Output of the laser is carried via a flexible, curved optical fiber 38 from the laser assembly 36 to the bonding tool 16, as will be more particularly described below. It will be readily understood that the optical fiber indicated at 38 in FIG. 1 includes a suitable optical fiber and a support housing therefore arranged for the purpose of supporting and directing the optical fiber from the laser to the bonding tool, and for allowing limited motion of the tool 16 (and optical fiber end) relative to the laser assembly 36. Such limited relative motion includes the Z axis travel of bonder slide frame 11, which may be less than 0.5 inches from stop to stop.

Figure 2:
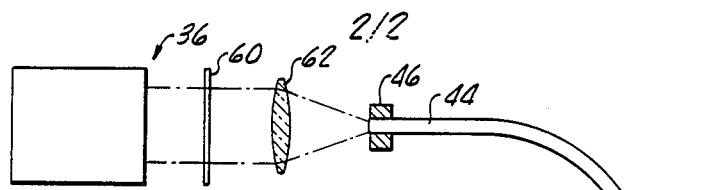
FIG. 2 illustrates the assembly of a capillary tube and optical fiber for applying pressure, heat and ultrasonic energy to a lead to be bonded.
Figure 2:
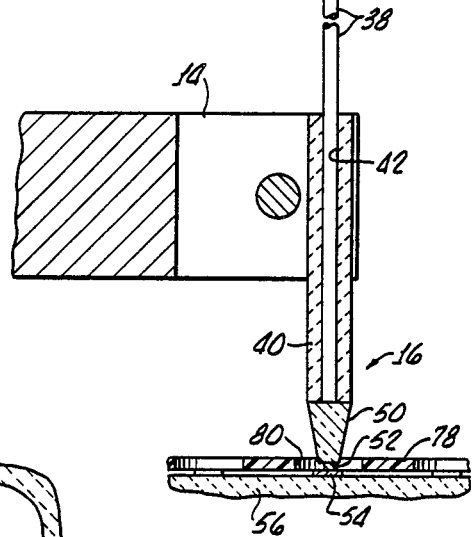

As illustrated in FIG. 2, the new type of bonding tool 16 comprises an elongated hollow capillary 40 that is securely mounted with its axis extending substantially vertically (parallel to Z axis) in the end of the transducer arm 14 which is fixedly connected to the ultrasonic transducer 10. Capillary 40 has an axial internal bore 42 in which is firmly and securely mounted an end portion of optical fiber 38. The fiber has a remote end 44 fixedly connected to laser assembly 36 in a laser output fitting 46. The laser 36 may be a conventional laser, such as, for example, an Nd:YAG continuous wave (CW) laser, having an output beam at a wavelength of 1.06 microns. The capillary bore typically has a diameter of about three thousandths of an inch (0.003 inches), and may be slightly tapered, being somewhat smaller at its lower end, to receive the end of the optical fiber and snugly and frictionally retain the fiber in position.

Figure 3:
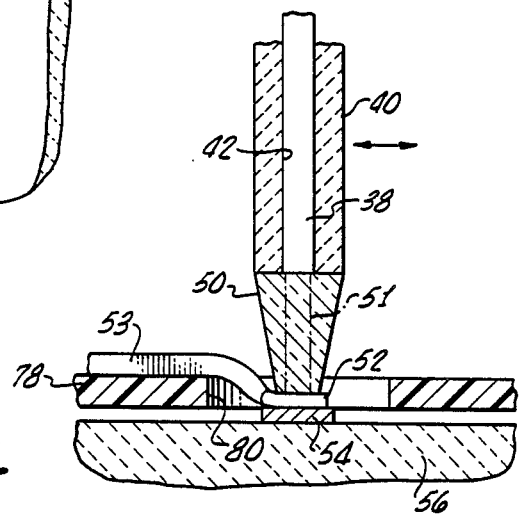
FIG. 3 is an enlarged illustration of a portion of the tip of the bonding tool.

As can be best seen in FIG. 3, the capillary bore does not extend through the capillary tip. Instead, the tip is formed by a solid pressure foot 50 that is fixed to the end of the capillary. The pressure foot is made of a hard, long-wearing material, such as sapphire or ruby, transparent to the 1.06 micron wavelength laser beam. The end of the optical fiber is in direct end face contact with the sapphire tip. The capillary is formed of a nonwetting material, a material to which solder will not adhere. Such a material for the capillary may include an alumina or a beryllia. The sapphire pressure foot is also non-wetting and transparent to the laser beam 51 that is transmitted from the end of fiber 38.

As illustrated in FIG. 2, the continuous wave laser beam is pulsed by use of a beam shutter 60 to provide a pulsed laser beam focused by a lens 62 at the outer edge of the pressure foot 50 of the capillary tube 40. These laser pulses apply heat energy to a part, such as the end 52 of an electrical wire lead 53, illustrated in position under the capillary tube pressure foot in FIGS. 2 and 3. This applied heat energy melts the solder of the pre-tinned leads.

In operation of the illustrated soldering machine, ends of leads to be soldered are pre-tinned, that is, they are coated by any suitable means with an appropriate solder. The lead is positioned with an end 52 to be soldered over a pad 54 on a substrate 56 to which the lead is to be soldered. The table 34 is maneuvered appropriately in X,Y horizontal directions to position the area at which the lead is to be soldered directly under the pressure tip of the bonding tool 16. Elevation motor 13 is then operated to drive the bonding head, including frame 11, transducer lo and tool assembly 16, downwardly until a predetermined pressure, such as pressure in the order of between ten and thirty grams, is applied by the bonding tool tip to the lead to be bonded. The above identified patents to Hill describe the application of the pre-load or pre-selected pressure by the tip of the bonding tool. In U.S. Pat. No. 4,817,848 filed May 12, 1988, of John B. Gabaldon, for Compliant Motion Servo, there is described a servo arrangement for maintaining a pre-selected force between a bonding tool tip of the type described in the Hill patent and illustrated in FIG. 1 and the wire to be bonded. Disclosures of the above-identified patents to Hill and the patent application of Gabaldon identified above, all of which are assigned to the assignee of the present application, are incorporated herein by this reference as though fully set forth. The Hughes Model 2460-II Automatic Wire Bonder employs the described force solenoid to provide a programmed level of force.

Having pressed the pressure tip 50 of the bonding tool downwardly upon the lead end to press it against the bonding pad and substrate upon which it rests, heat an ultrasonic energy may now be applied. A wide variety of timed programs for application of heat and ultrasonic energy is contemplated, such programs preferably starting after appropriate pressure has been applied to press the lead downwardly, and each such program being carried out at least initially while such pressure is being maintained. For example, both ultrasonic energy and heat energy may be applied simultaneously while the pressure exerted on the lead by the tool tip 50 is maintained. Alternatively, ultrasonic energy may be first applied (while the tool tip presses the lead), the application of ultrasonic energy stopped, and then the optical energy or heat energy may be applied through the optical fiber. A still further variation is a reversal of the last described procedure, carried out by applying heat energy through the optical fiber first, and, after completing application of the heat energy, then applying the ultrasonic energy. Pressure may be applied during the entire program, and at least during the application of ultrasonic vibration. Many other variations may be carried out, including various programs in which there is at least some degree of overlapping or simultaneous application of both heat energy and ultrasonic energy. Preferably, pressure is generally, but not always, applied during application of ultrasonic energy.

As heat is applied to the pre-tinned lead, its solder coating softens and begins to flow. After the solder begins to flow, which may require a short time, such as five to ten milliseconds of application of heat energy, the laser may be turned off and the bonding frame and bonding tool may be raised a very small amount, such as about five to ten mils, to allow solder to flow between the two parts being soldered, and thus provide a better, more aesthetically pleasing joint. In this procedure, of course, pressure is not applied while the tool is slightly raised, although application of ultrasonic energy may be continued, if desired.

Throughout the described steps the laser beam pulse (when the laser is turned on) is focused through the capillary tube down to a spot size of about three to five mils at the wire end. The laser has an output pulse of approximately five to fifty milliseconds and provides ten to one hundred watts of output power. A single laser pulse may provide sufficient heat energy. The ultrasonic transducer operates at about sixty kilohertz, with a power of about ten watts and has a capillary tip movement (when driven by the ultrasonic transducer) of about seventy five microinches in a direction parallel to the Y axis.

It will be readily appreciated that use of the described bonding apparatus and method permits the soldering of a multiplicity of leads individually so that relative elevations and collective planarity of a number of bonding pads on a substrate has little adverse effect on the operation. According to the described method, using the apparatus illustrated herein, individual sensing of bonding height (available from the prior bonding machines that may be modified for use in this ultrasonic laser system) is accomplished, thus avoiding the need for the previously required extremely tight control of pad height or substrate planarity.

Application of ultrasonic energy during application of or combined with application of heat energy enhances the wetting of the parts by the solder, without need of flux. Therefore, no flux need be employed in the soldering process described herein.

The bonding tool 16 performs a number of functions in the described embodiment. The tip of the tool effectively senses the height of the lead by initiating a suitable signal upon first contact between the tool tip and the lead. The tool tip holds the lead against the underlying substrate or pad surface. The tool tip actually physically applies the ultrasonic energy to the lead being bonded, and, further, the tool tip directs the heat, via the optical fiber, directly to the lead that is being soldered. In an exemplary program, ultrasonic energy may be applied for a time (such s five to ten milliseconds) equal to the time of application of heat energy. Such times will vary with different applications, materials and configurations. Similarly, the amount of pressure applied during application of ultrasonic energy will vary according to materials and configuration. Pressure in the order of about ten grams is presently contemplated.

As integrated circuits become more complex, providing a larger number of functions, higher density of the outgoing leads becomes necessary. A technique termed "tape automated bonding" (TAB) is used in a high density bonding procedure that generally employs reflow soldering of leads to active semiconductor devices and to various types of substrates. The present invention is especially useful in tape automated bonding.

Figure 4:
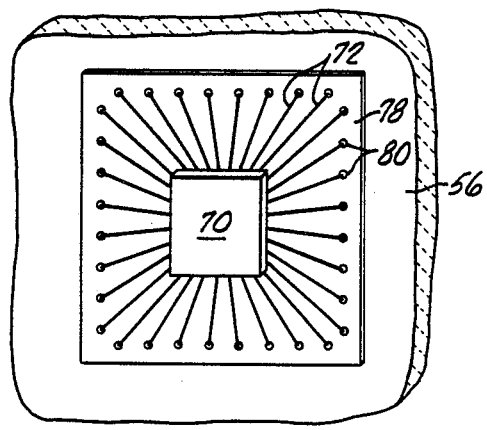
FIG. 4 illustrates a chip assembly to be bonded by tape automated bonding procedures embodying the present invention.

An arrangement of such tape automated bonding is illustrated in FIG. 4, in which a chip 70 has a surface opposite that shown in the drawing (e.g. a "lower" surface, not seen in FIG. 4) on which a number of connecting pads are provided, with each one of a number of leads, such as leads 72, having its inner end physically and electrically connected to an individual pad. Conveniently, such connections of inner ends of leads 72 to the chip pads are performed by a single thermode, which simultaneously heats all pre-tinned inner ends of the wires, and thus solders these to the chip pads. However, as previously described, the outer ends of the leads 72 are to be soldered to pads, such as pads 54, on a substrate, such as indicated generally at 56, which may well have significant elevation variations in the bonding surfaces of the connecting pads, and thus provides very poor planarity. Planarity of the chip itself is usually adequate for bonding of lead inner ends by conventional methods, such as a thermode.

In devices involved with tape automated bonding, a very high density of electrical leads is provided, so that a single chip may have from two to three hundred leads extending therefrom. The leads are frequently printed on a thin sheet 78 of mylar (FIGS. 3 and 4), having through holes 80 at the outer ends of each of the leads 72. The leads are printed on the mylar for ease of handling and connection. Leads on such an assembly may be approximately 2 mils in width and have a center to center spacing of 4 mils at their inner ends. Generally such leads are of a rectangular cross section, and solder connections of such leads are preferred for ease of repairability.

Previous methods for soldering outer ends of the wires 72 in a tape automated bonding process have required use of flux on the pre-tinned wire ends. Such use of flux is undesirable because it introduces contamination in these very high density lead circuits. It is found that the application of ultrasonic energy in a soldering operation of the type described herein eliminates the need for application of solder flux. Thus, the described method and apparatus provide a useful, efficient, fluxless soldering. Accordingly, it will be seen that the present invention is directly adaptable to the performance of soldering of at least outer ends of the leads 72 and may also find application in soldering inner ends of the leads to the chip of a tape automated bonding operation.

Particularly in the outer end bonding, it is necessary to consistently hold the lead down and to apply a repeatable but light force to the lead. The described method and apparatus will accomplish this desired result effectively. Apparatus described in the above-identified patents and patent application, as set forth in detail therein, and the Hughes Model 2460-II Automatic Wire Bonder of FIG. 1, are arranged to consistently hold the lead down and apply a light, predetermined and repeatable force to the wire while the tool is ultrasonically vibrated.

After touchdown and application of the desired force, the timed program of laser energy and ultrasonic energy may commence. As an example, during application of heat from the laser pulse, ultrasonic energy may be introduced by activating the transducer 10. The ultrasonic energy need be applied only at relatively low power, at approximately 60 kilohertz, providing a capillary tip movement in the order of about 75 microinches.

In conventional solder bonding, heat is applied while constant pressure is exerted against the lead. This prevents the flowing solder from moving under the soldered lead. In accordance with the present invention, and with the availability of precise vertical height control of the bonding tool (as described in the above-identified patents and patent application and in the Hughes Model 2460-II Automatic Wire Bonder), the entire vertically movable bonding head, together with the capillary and its pressure foot, are raised slightly, as previously described, after initiation of heat application by the laser pulse to allow solder to flow and form a consistent and attractive fillet under the lead. This provides a cleaner appearance that pleases visual inspectors, and, more importantly, adds significant strength to the bond. It is important that this raising of the capillary take place only after the solder has melted and begins to flow.

Thus it will be seen that the method and apparatus described herein are applicable to a number of different types of bonding, and are particularly applicable to fluxless reflow soldering, to the soldering of outer leads, and to reflow soldering of inner and/or outer leads of a tape automated bonding process.

What is claimed is:

1. A method of bonding first and second members to each other comprising the steps of:

pressing the members against one another at an area thereof to be bonded,
   applying heat energy to one of the members at said area by directing a laser beam at said one of said members, and
   applying sonic energy to one of the members at said area.

2. The method of claim 1 wherein at least part of said steps of applying heat and sonic energy are performed at the same time.

3. The method of claim 1 wherein said step of pressing comprises urging a pressure member against a first one of the members, said step of applying heat energy comprising directing a beam of laser energy along said pressure member to said first member, said step of applying sonic energy comprising connecting the pressure member to an ultrasonic transducer and energizing the transducer.

4. The method of claim 1 wherein said members are solder-coated, said method further including the step of separating the members from one another after application of heat energy, so as to allow said solder to flow between the members.

5. Apparatus for soldering a lead to a substrate comprising:

a pressure tool having a pressure tip for pressing against a lead,
   means for vibrating the tool at an ultrasonic frequency,
   means for projecting a laser beam at a lead at said pressure tip, and
   means for moving the tool to press said tip against said lead.

6. The apparatus of claim 5 wherein said means for applying heat comprises an optical fiber having an end positioned adjacent said tool tip, and a laser connected to transmit laser energy through the fiber.

7. The apparatus of claim 6 wherein said means for vibrating the tool comprises an ultrasonic transducer and means for connecting the tool to the transducer.

8. The apparatus of claim 5 wherein said tool has a tool bore extending to said tip, and wherein said means for applying heat comprises optical fiber means extending through said bore to said tip, and laser means for transmitting a beam of laser energy through the optical fiber means.

9. The apparatus of claim 8 wherein said tip is formed of a solid material that is transparent to said laser energy.

10. The apparatus of claim 8 wherein said tip is made of sapphire.

11. The apparatus of claim 8 wherein said tool is made of a non-wetting material.

12. The apparatus of claim 11 wherein said tool is made of a dielectric material.

13. The apparatus of claim 12 wherein said tool is made of material belonging to the group which includes alumina and beryllia.

14. The apparatus of claim 5 wherein said laser beam is focused on said lead.

15. The apparatus of claim 5 wherein said pressure tip is solid and is capable of transmitting a beam of laser energy, and wherein said means for projecting a laser beam is operative to project said laser beam through said tip.

16. A method of soldering of first and second pre-tinned members without the use of flux comprising the steps of:

pressing the members together at a common area to be soldered, and applying a timed program of heat energy and ultrasonic energy to one of the members.

17. The method of claim 16 including the step of employing a capillary having a bore to both press the members and to apply ultrasonic energy, and wherein said step of applying a program of heat energy comprises directing a beam of laser energy through the bore of said capillary.

18. The method of claim 17 including the step of moving the capillary away from the members by a small amount to allow heated solder to flow between said members.

19. A wire bonder comprising:

a support, a worktable connected to the support for carrying an object to which a wire is to be bonded, a bonder frame, means for mounting the frame to the support for motion in a first direction toward and away from the worktable, motor means for driving the frame in said direction, a transducer support, an ultrasonic transducer carried on said support, a bonder tool connected to the transducer for movement therewith, said tool comprising a capillary having a solid pressure tip for pressing a lead to be bonded against an object on the worktable, said capillary having a bore extending to the tip, said tip being transparent to laser energy, means for mounting the transducer support to the bonder frame for motion relative to the bonder frame in said direction, an optical fiber positioned in the bore and having a fiber end at said pressure tip, and a laser having a laser beam output connected to said optical fiber.

20. The bonder of claim 19 including means for energizing the laser and the transducer during a common short interval, whereby both heat energy and ultrasonic energy may be applied by said pressure tip to a lead pressed by the pressure tip against an object on the worktable.

21. A method of bonding first and second solder-coated members to each other comprising the steps of:

pressing the members against one another at an area thereof to be bonded, applying heat energy to one of the members at said area by directing a laser beam directly at said one member, applying sonic energy to one of the members at said area, and separating the members from one another after application of heat energy, so as to allow the solder coating to flow between the members.

* * * * *